United States Patent [19]
Gaboury et al.

[11] Patent Number: 5,291,044
[45] Date of Patent: Mar. 1, 1994

[54] IMAGE SENSOR WITH CONTINUOUS TIME PHOTODIODE

[75] Inventors: Michael J. Gaboury, Spencerport; Teh-Hsuang Lee; Webster; Eric G. Stevens, Rochester, all of N.Y.

[73] Assignee: Eastman Kodak Company, Rochester, N.Y.

[21] Appl. No.: 626,155

[22] Filed: Dec. 12, 1990

[51] Int. Cl.$^5$ ............... H01L 29/78; H01L 27/14; H01L 31/00

[52] U.S. Cl. .................. 257/230; 257/223; 257/232; 257/233; 377/60; 377/62; 348/314

[58] Field of Search ............ 357/24 LR; 358/213.19, 358/213.26, 213.29; 257/223, 229, 230, 232, 233; 377/60, 62

[56] References Cited

U.S. PATENT DOCUMENTS

| | | | |
|---|---|---|---|
| 4,644,572 | 2/1987 | Lambeth | 377/60 |
| 4,678,938 | 7/1987 | Nakamura | 357/24 LR |
| 4,733,302 | 3/1988 | Kinoshita et al. | 357/24 LR |
| 4,907,050 | 3/1990 | Yamada | 357/24 LR |
| 4,984,047 | 1/1991 | Stevens | 357/24 LR |

Primary Examiner—Ngan Ngo
Attorney, Agent, or Firm—David M. Woods

[57] ABSTRACT

In a solid state image sensor, such as a CCD image sensor having lateral antiblooming protection, the level of which is controlled by an overflow gate voltage forming a barrier, the storage of electrons in the photodiode junction region of the sensor is eliminated by removing the barrier and allowing the charge to flow from the sensor's photodiode junctions into the overflow region. The charge flow is then detected as a function of the instantaneous light impinging on the photodiodes. The physical connections of the overflow gates are selected to form zones. Since the charge flow now represent the instantaneous light intensity, higher frequency components are detected than that limited by the sensor sampling rate. An amplifier is connected to sense the charge flow from each zone. With the range of light intensity being large the amplifier is provided with a logarithmic feed back element. This element provides compression of a signal representing the sensed charge flow.

6 Claims, 3 Drawing Sheets

IMAGE SENSOR WITH CONTINUOUS TIME PHOTODIODE

TECHNICAL FIELD OF THE INVENTION

The present invention relates to solid state image sensors, for example, charge coupled image sensors (CCDs) and more particularly to a solid state image sensor which can also operate as a continuous time photodiode.

BACKGROUND OF THE INVENTION

The quality of electronic imaging, like any other form of photography, is a function of lighting conditions. Many conventional film cameras use photodiodes in single or matrix configurations to adjust exposure. The possibility also exists for doing illuminant color detection or type detection as described in U.S. Pat. No. 4,827,119. The illuminant detection described in that patent requires a real time signal input. Electronic still cameras already have a sensor for detecting light and for providing a real time signal. It therefore would be advantageous to use this same sensor. The state of solid state image sensors has advanced to the point that overflow protection is provided for preventing a phenomena called "blooming" from occurring. This phenomena is defined as the spreading of the charge accumulated in a light sensing element in such a way as to interact with the charges accumulated in adjacent light sensing elements. Various techniques are used to eliminate or control "blooming". Some examples are provided in the following patents:

U.S. Pat. No. 3,896,485, entitled "Charge-Coupled Device with Overflow Protection" by Early.

U.S. Pat. No. 3,896,474, entitled "Charge Coupled Area Imaging Device with Column Anti-Blooming Control" by Amelio et al.

U.S. Pat. No. 4,242,599, entitled "Charge Transfer Image Sensor with Antiblooming and Exposure Control" by Suzuki.

U.S. Pat. No. 4,373,167, entitled "Solid State Image Sensor with Overflow Protection and High Resolution" by Yamada.

SUMMARY OF THE INVENTION

The invention is an improvement in a solid state image sensor of the type having lateral antiblooming protection, the level of which is controlled by an applied voltage on an overflow gate forming a barrier to charge flow into an overflow channel. The improvement provides a continuous time output signal indicative of the instantaneous light impinging on the photosites of the image sensor. A control voltage is applied to the sensor for controlling the barrier such that no charge is stored at the photosites and the charge flow is a function of the instantaneous light impinging on said photosites. An amplifier is coupled to the solid state image sensor for receiving the charge flow from the overflow channels and for providing as a function of the charge flow the continuous time output signal.

From the foregoing it can be seen that it is a primary object of the present invention to provide an improved image sensor having the capability of providing a signal which is a function of the instantaneous light intensity impinging thereon.

It is another object of the present invention to provide an image sensor for individually determining the instantaneous light intensity from each of a plurality of zones of the scene imaged on the sensor.

Another object of the invention the provision of an image sensor from each of plurality of zones of the scene wherein two or more zones are interconnected.

Still another object of the present invention is the provision of an image sensor for providing the ability to detect frequency components of the light intensity higher than that detected with the sampling rates of the sensor.

Yet another object of the present invention is to provide an image sensor that provides signals containing the higher frequency components of the impinging light.

These and other objects of the present invention will become more apparent when taken in conjunction with the following description and drawings wherein like characters indicate like parts and which drawings form a part of the present invention.

DESCRIPTION OF THE PREFERRED EMBODIMENTS

The present invention will be described as implemented in silicon semiconductor material, but it is to be understood that other types of material may be equally effective.

Figure 1:
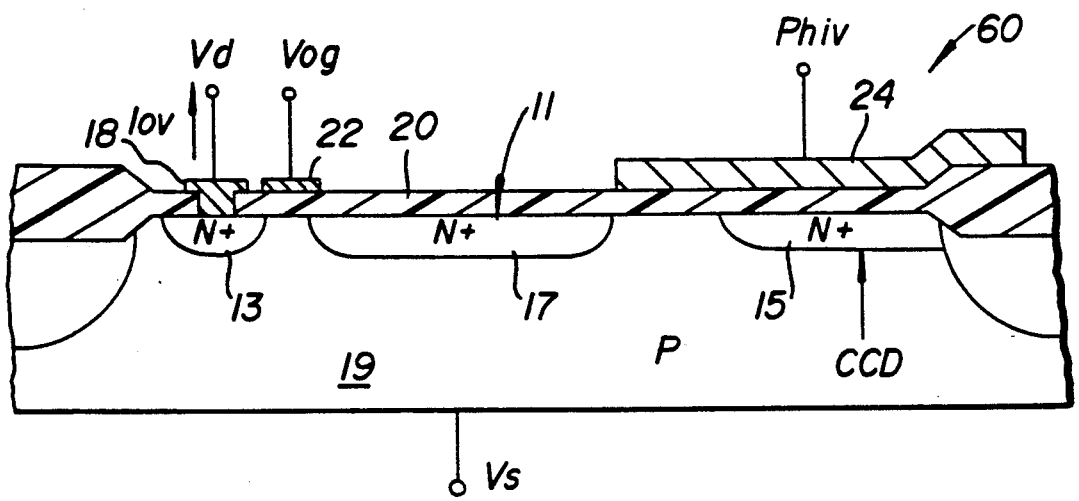
FIG. 1 illustrates in cross sectional view the diode structure of the present invention in conjunction with a sectioned portion of a CCD array.

In FIG. 1, the cross section of a portion of an image sensor 60, with overflow protection, is illustrated. The sensor is formed on a substrate 19 that is coupled on its back surface to a potential source Vs. The substrate 19 may be formed of P-type material. A number of charge sink regions (channels), 11, 13 and 15, are formed in the substrate material by implanting or diffusing into the substrate an N-type impurity such as phosphorous to form N+ type regions. The channel 13 is the overflow channel, the channel 15 is the CCD, or signal charge coupling channel, and the channel 17 is the well for storing the electrons from the photodiode action. Between these two channels is a wall 14 of substrate material. An insulating layer 20 is positioned over all of the channels except for the overflow channel 13. An electrode 18 of conductive material is deposited in contact with the material of channel 13. A separating wall 12, formed from substrate material, is positioned between overflow channel 13 and photosite 17. A potential Vd is applied to the electrode 18. A gate 22, formed of conductive material, is positioned over the wall 12 and is coupled to a potential Vog. A conductive tab 24 is positioned over the CCD channel 15 including the wall 14 to provide a clocking signal Phiv for clocking out the charge accumulated in the well 17 to the channel 15 when the image is to be read from the sensor 60.

Figure 2:
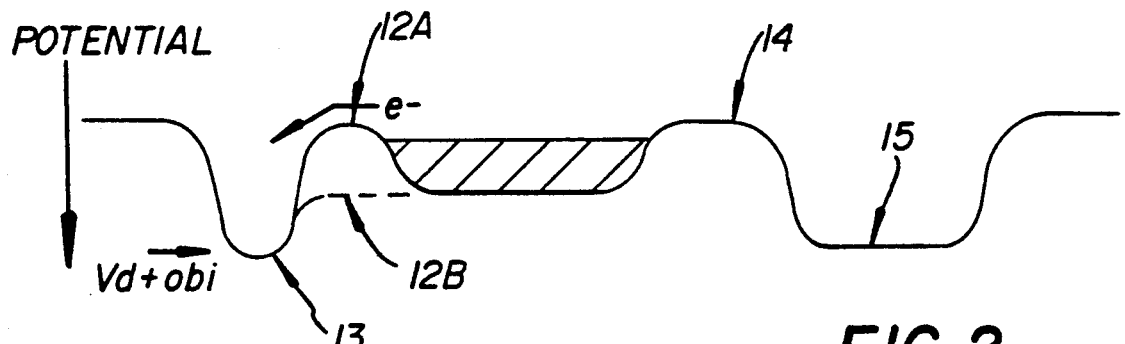
FIG. 2 is a potential diagram corresponding to the structure of FIG. 1.

FIG. 2, illustrates, by way of a potential diagram, the operation of the invention. When the image sensor is operating in the read out mode the potentials Phiv and Vog are initially set to a level that forms a potential wall on each side of the channel 17 so that electrons are accumulated in the channel. Assuming a condition of no overflow, the electrons, at the appropriate time for read out, are transferred to the channel 15 by lowering the potential barrier between channels 17 and 15. When the image sensor is operating in illuminant detection mode the potential Vog is set to cause the potential wall to move from the level 12A to the level 12B, while the potential wall at 14 remains high. The electrons that are formed in channel 17 will flow directly to overflow channel 13 and to the electrode 18 without building up in channel 17. That flow of electrons is the current Iov. In the overflow mode when the number of electrons in channel 17 reaches a number that would cause a "blooming" if read out to channel 15 the electrons are allowed to bleed off to overflow channel 13 at a rate that is determined by the potential Vog. In a vertical overflow structure the barrier level is determined by geometry and doping profiles, and is a fixed value. In a lateral overflow structure of the type depicted in FIG. 1 the barrier level is set by the overflow gate voltage Vog.

Figure 3:
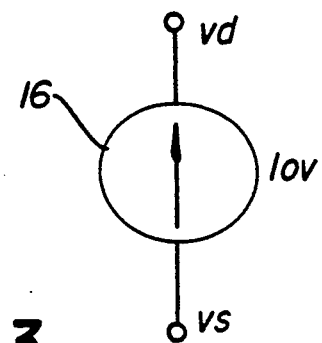
FIG. 3 is a symbol diagram representing a photodiode circuit of a portion of the preferred embodiment of FIG. 1.

When the current Iov reaches a steady value the device can be represented as a light controlled current source 16 shown, in FIG. 3.

Figure 4:
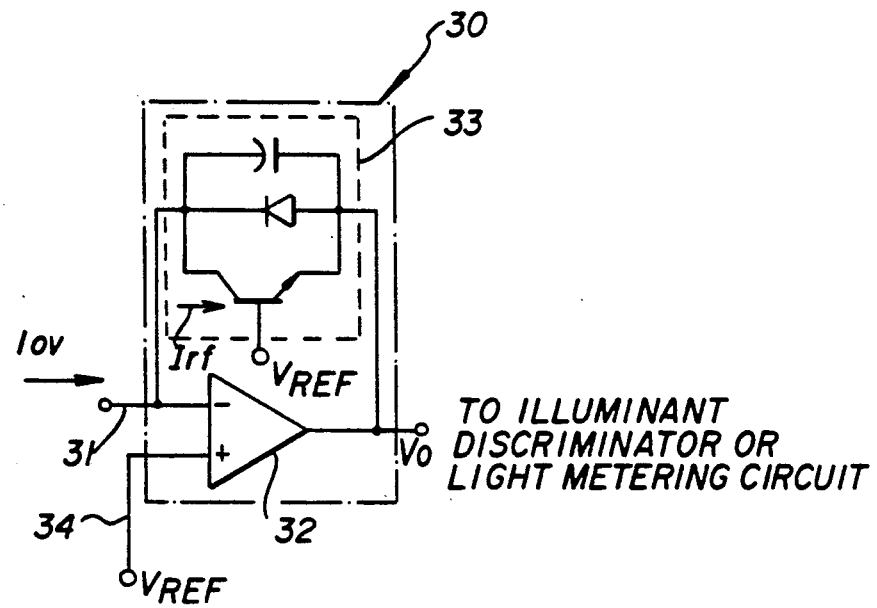
FIG. 4 is a circuit diagram of an amplifier that may be used in conjunction with the preferred embodiment of FIG. 1.

Referring to FIG. 4, a log amplifier 30, for detection of the current Iov, is formed with an amplifier 32 having inputs 31 and 34 and a feedback element 33, referenced to a voltage Vref, which provides a log function. Vref is also the bias voltage for the input 34. The current Iov enters an inverting input 31 of the amplifier 30 which is a summing node such that a feedback current Irf is equal to the current Iov. The output signal denoted Vo is equal to $-V_t \ln [Iov/BIs]$. The log amplifier is used to compress the large dynamic range of Iov representing the light impinging on the device.

Figure 5:
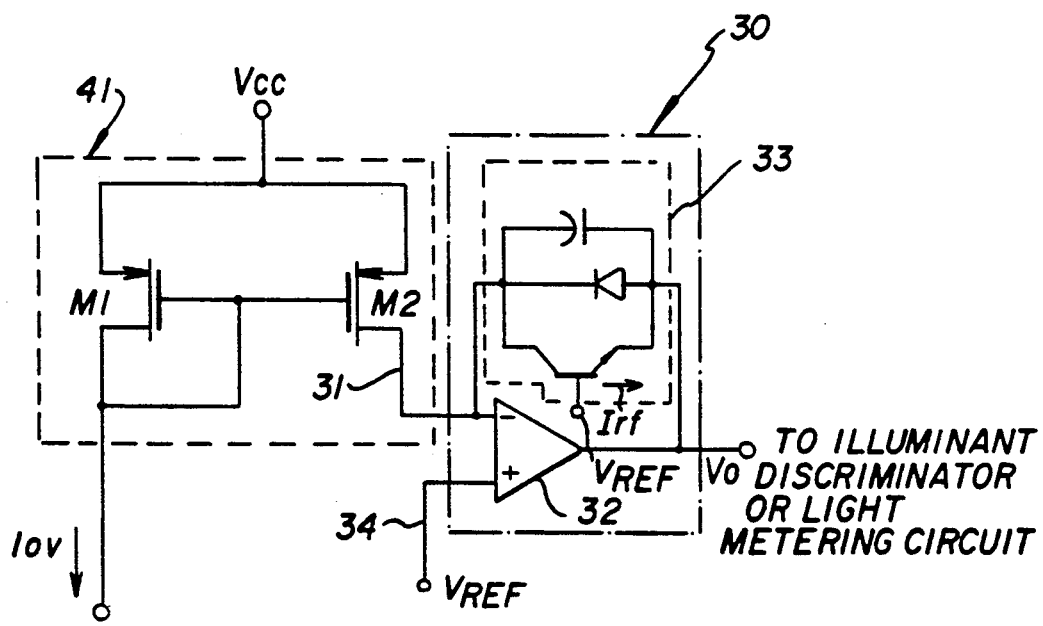
FIG. 5 is a circuit diagram, incorporating the circuit of FIG. 4, to provide level shifting and limited current gain of the photodiode signal.

In FIG. 5 there is shown an amplifier circuit that will remove the problem of level shifting. A current mirror 41 is coupled to the input 31 of the amplifier 30 and is driven by the detected photo current Iov. Some gain in this stage is possible by sizing the element transistors M1 and M2. Assuming that the gate lengths of M1 and M2 are equal, the gain is approximately w2/w1. In this configuration, the input 34 of the amplifier 32 is connected to the potential Vref, which potential is selected to insure that the amplifier output is biased at the level expected by any following signal processing circuitry.

Figure 6:
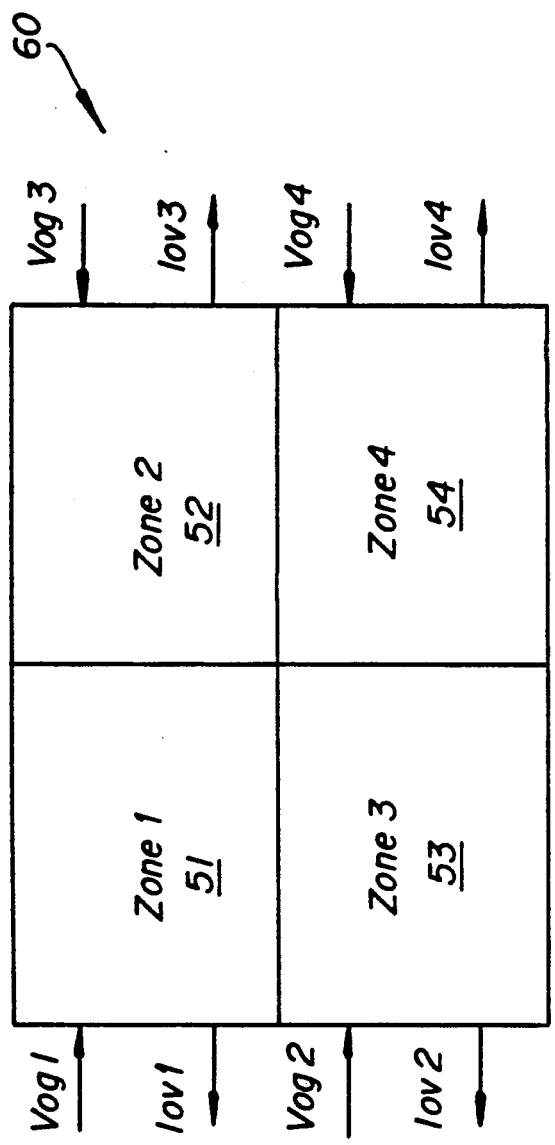
FIG. 6 illustrates the potential for segmenting an area array to form a multi-zone light meter.
Figure 7:
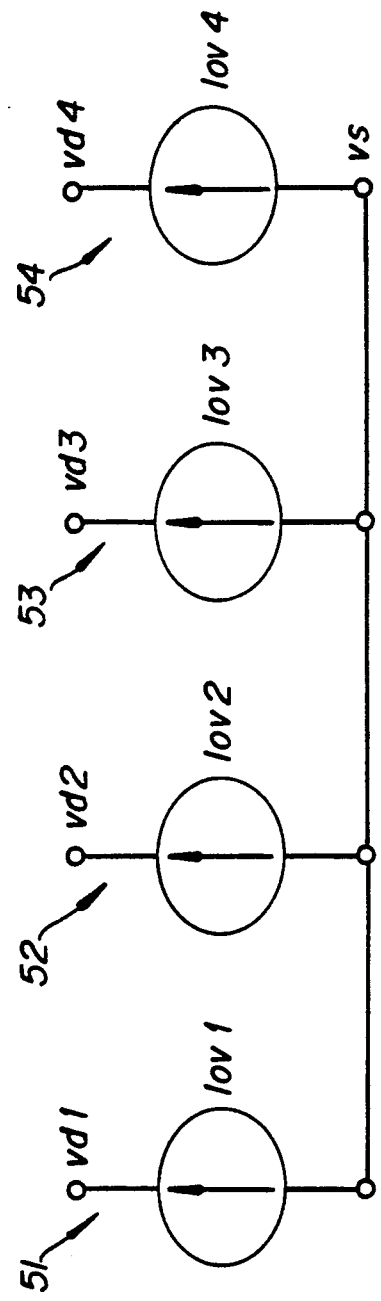
FIG. 7 utilizes the symbol of FIG. 3 to represent the equivalent of the multi-zone light meter shown in FIG. 6.

FIG. 6 illustrates a block schematic diagram of a four zone light meter 60. Each zone, 1 through 4, is comprised of several photodiodes represented collectively in FIGS. 6 and 7 as 51 through 54. Each zone having the overflow gates of their associated several photodiodes connected in common and controlled by separate overflow gate voltages Vog1 through Vog4, respectively. Each zone may in turn be used to determine the instantaneous light intensity impinging on each, respective zone. It is to be appreciated that two or more of the zones may be interconnected to form a desired output. A schematic representation of the equivalent circuit is shown in FIG. 7 where each of the individual currents Iov1 through Iov4 represents the light falling on the associated zone of FIG. 6. Although four zones are shown the number can be extended to any number of zones. The geometrical shape of zones is limited only by the ability to connect the respective overflow gates together.

While there has been shown what is considered to be the preferred embodiments of the invention, it will be manifest that many changes and modifications may be made therein without departing from the essential spirit of the invention. It is intended, therefore, in the annexed claims, to cover all such changes and modifications that may fall within the true scope of the invention.

We claim:

1. In a solid state image sensor having lateral anti-blooming protection, the level of which is controlled by an applied voltage on an overflow gate forming a barrier to charge flow into an overflow channel, the improvement of providing a continuous time output signal indicative of the instantaneous light impinging on the photosites of the image sensor comprising:

means for providing a control voltage to said sensor for controlling the barrier such that no charge is stored at the photosites and the charge flow is a function of the instantaneous light impinging on said photosites; and amplifier means coupled to said solid state image sensor for receiving the charge flow from the overflow channels and for providing as a function of the charge flow a continuous time output signal.

2. At least two solid state image sensors according to claim 1 wherein a larger solid state image sensor is formed through the electrical connection of the overflow gates of each solid state image sensor and the electrical connection of each solid state image sensors' overflow channel to provide a single output from said formed larger solid state image sensor to said amplifier means.

3. A solid state image sensor comprising:

a plurality of photosensitive elements formed into a number of zones for providing a charge flow as a function of the instantaneous illumination impinging on each of the zones and for also providing the charges generated by each photosensitive element individually to enable the detection of an image;

a number of overflow channel means corresponding in number to the number of zones for receiving the charge flow from a respective zone; and amplifier means connected to said overflow channel means for receiving the charge flow from said overflow channel means and for providing an output indicative of the instantaneous illumination on each of the number of zones.

4. A CCD image sensor having charge storage regions coupled to photosensitive sites comprising:

storing means for storing the charge generated by said photosensitive sites as a function of the illumination impinging thereon;

control means coupled to said means for storing for controllably preventing the storage of charge and for causing a charge flow from said photosensitive sites as a function of the instantaneous illumination thereon; and amplifier means for receiving the charge flow from said means for storing.

5. The CCD image sensor according to claim 4 wherein said image sensor is formed into zones through the connection of a number of photosensitive sites defining a zone; and means for providing a single output to said amplifier means as a function of the illumination on each zone.

6. The CCD image sensor according to claim 5 wherein two or more of said zones are connected together.

* * * * *